(12) United States Patent
Chou

(10) Patent No.: US 6,740,867 B2
(45) Date of Patent: May 25, 2004

(54) VIBRATION SWITCH

(76) Inventor: Tien-Ming Chou, No. 41, San-Hsi 5th St., Pei Dist., Taichung City (TW)

( * ) Notice: Subject to any disclaimer, the term of this patent is extended or adjusted under 35 U.S.C. 154(b) by 0 days.

(21) Appl. No.: 10/321,929

(22) Filed: Dec. 17, 2002

(65) Prior Publication Data

US 2004/0069935 A1 Apr. 15, 2004

(51) Int. Cl.$^7$ .............................. G01D 5/34; H01H 35/02
(52) U.S. Cl. .............. 250/231.1; 250/239; 200/61.45 R
(58) Field of Search .............................. 250/231.1, 239, 250/229, 221, 551; 200/61.45 R, 61.52; 33/366.24; 73/514.26; 340/689

(56) References Cited

U.S. PATENT DOCUMENTS 6,011,254 A * 1/2000 Sano et al. .............. 250/231.1

2003/0057361 A1 * 3/2003 Chou ......................... 250/221

* cited by examiner

*Primary Examiner*—Kevin Pyo
(74) *Attorney, Agent, or Firm*—Brooks Kushman P.C.

(57) ABSTRACT

A vibration switch includes an optoelectronic sensor member with light emitting and receiving units disposed in an insulating housing. A light-transmission rollable member is received in the housing, is disposed on a light beam route confined by the emitting and receiving units, and is movable between a rest position, where the rollable member interferes with a light beam emitted from the emitting unit such that the resultant light beam received by the receiving unit has a first light intensity, and a liable position, where, due to a jerking force acting on the housing, the resultant light beam has a second light intensity which differs from the first light intensity by a predetermined quantity such that an actuator can be actuated to put electric contact terminals in one of switch-on and switch-off states.

7 Claims, 5 Drawing Sheets

VIBRATION SWITCH

BACKGROUND OF THE INVENTION

1. Field of the Invention

This invention relates to a vibration switch, more particularly to a vibration switch with an optoelectronic sensor member which is controlled by the displacement of a light-transmission rollable member to place two electric contact terminals in one of switch-on and switch-off states.

2. Description of the Related Art

Referring to FIG. 1, a conventional vibration switch 1 is shown to include an insulating housing 11 with an accommodation chamber 111 formed therein for receiving an electric conductive ball member 14. A pair of electric contact terminals 12,13 have upper ends 121,131 which are received in the accommodation chamber 111, and lower ends 122,132 which are disposed outwardly and downwardly of the housing 11. When the housing 11 is in an upright state shown in FIG. 1, the ball member 14 contacts the upper ends 121,131 of the terminals 12,13 to place the terminals 12,13 in a switch-on state. Once the housing 11 is tilted or vibrated, the ball member 14 is moved to disengage the upper ends 121,131, thereby placing the terminals 12,13 in a switch-off state. However, when the vibration switch 1 is used in a moist place, the ball member 14 is liable to oxidize, thereby resulting in unstable electrical connection between the terminals 12,13.

SUMMARY OF THE INVENTION

The object of the present invention is to provide a vibration switch which can provide a stable electrical connection between two electric contact terminals.

According to this invention, the vibration switch includes an insulating housing which is adapted to be mounted on a support in an upright direction, and which includes an inner wall that confines an accommodation chamber therein. An optoelectronic sensor member is secured to the housing, and includes light emitting and receiving units which are disposed opposite to each other in a transverse direction relative to the upright direction. The light emitting and receiving units respectively define a light emitting path and a light receiving path which extend through the inner wall and into the accommodation chamber to cooperatively establish a light beam route for passage of a light beam that is emitted from the light emitting unit and that is received by the receiving unit. Two electric contact terminals are respectively and electrically connected to the light receiving unit, and extend downwardly and outwardly of the housing so as to be adapted to be connected electrically to the support. A rollable member is made from a light-transmission material, and is rollable in the accommodation chamber between a rest position, where the rollable member is disposed on the light beam route with a first orientation so as to interfere with the light beam, such that the resultant light beam received by the receiving unit has a first light intensity, and where the insulating housing is in a stable position, and a labile position, where, due to a jerking force acting on the insulating housing, the rollable member is disposed on the light beam route, with a second orientation so as to interfere the light beam, such that the resultant light beam received by the receiving unit has a second light intensity that differs from the first light intensity by a predetermined quantity. The optoelectronic sensor member further includes an actuator which, in response of detection of the predetermined quantity, can put the electric contact terminals in one of switch-on and switch-off states.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
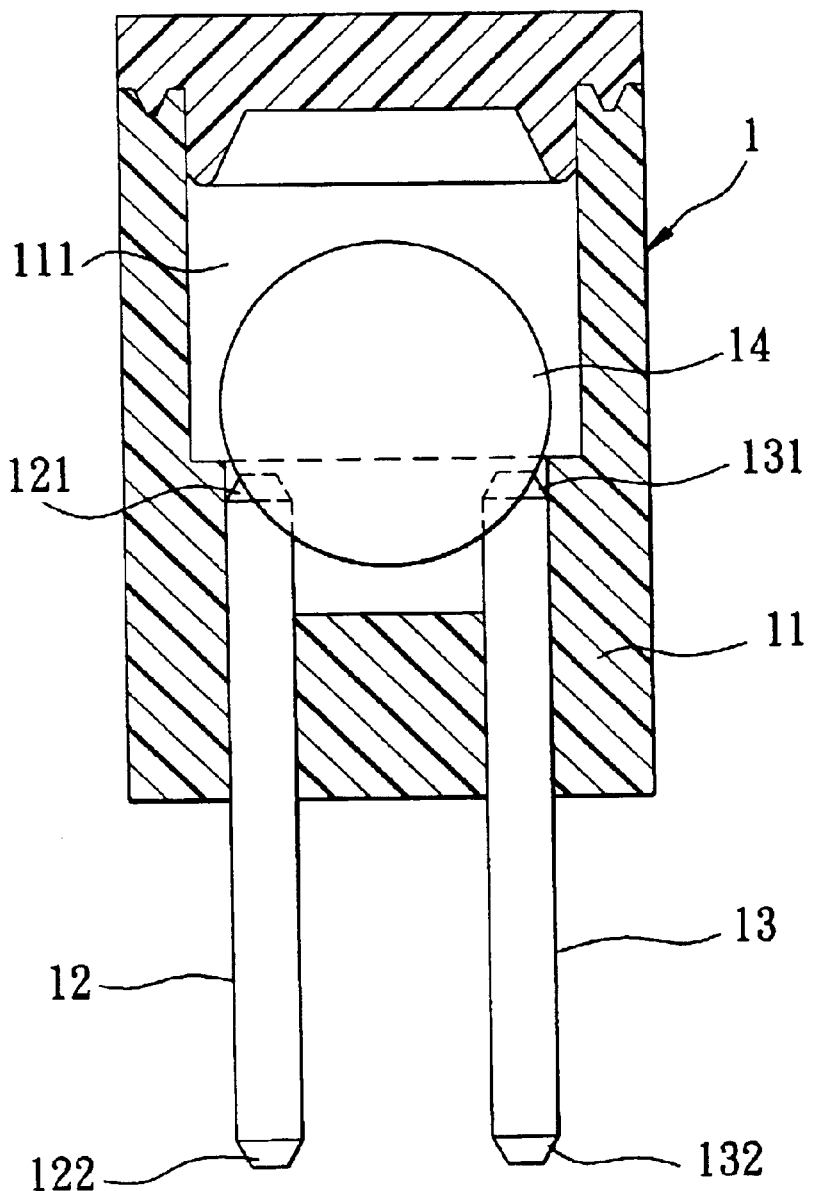
FIG. 1 is a sectional schematic view of a conventional vibration switch.
Figure 2:
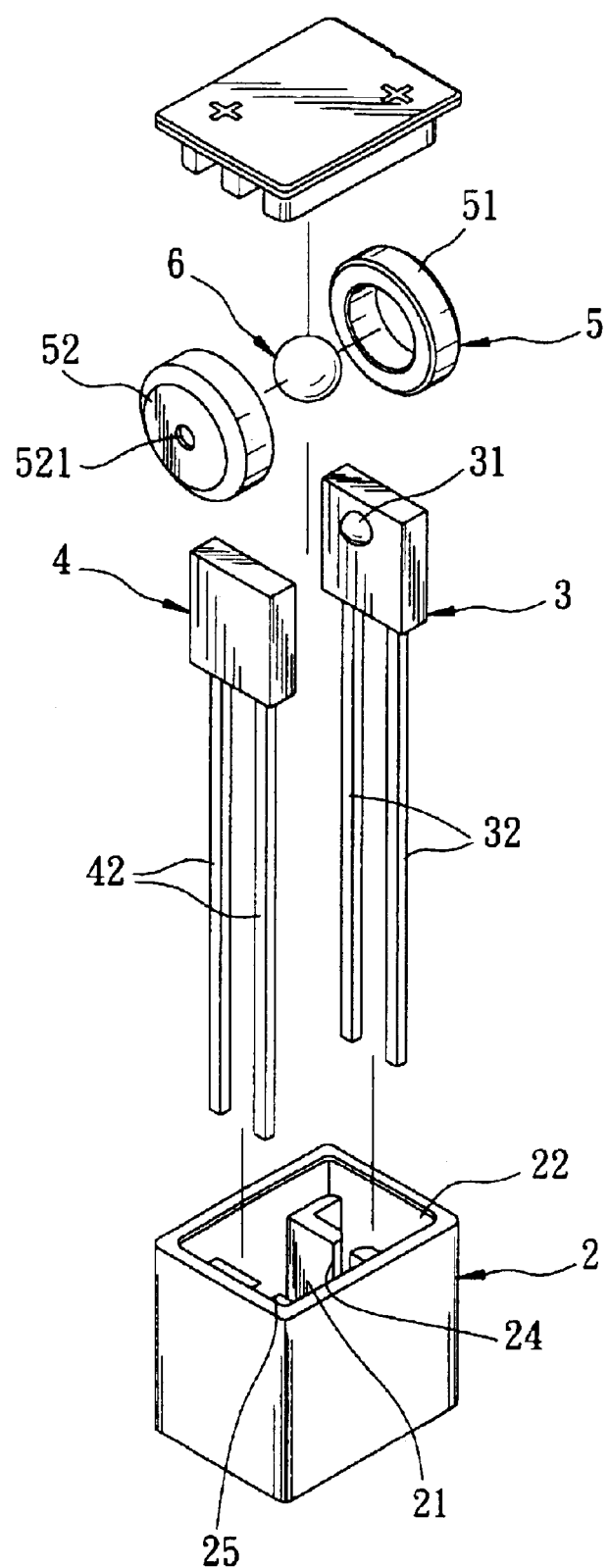
FIG. 2 is an exploded perspective view of a preferred embodiment of a vibration switch according to this invention.
Figure 3:
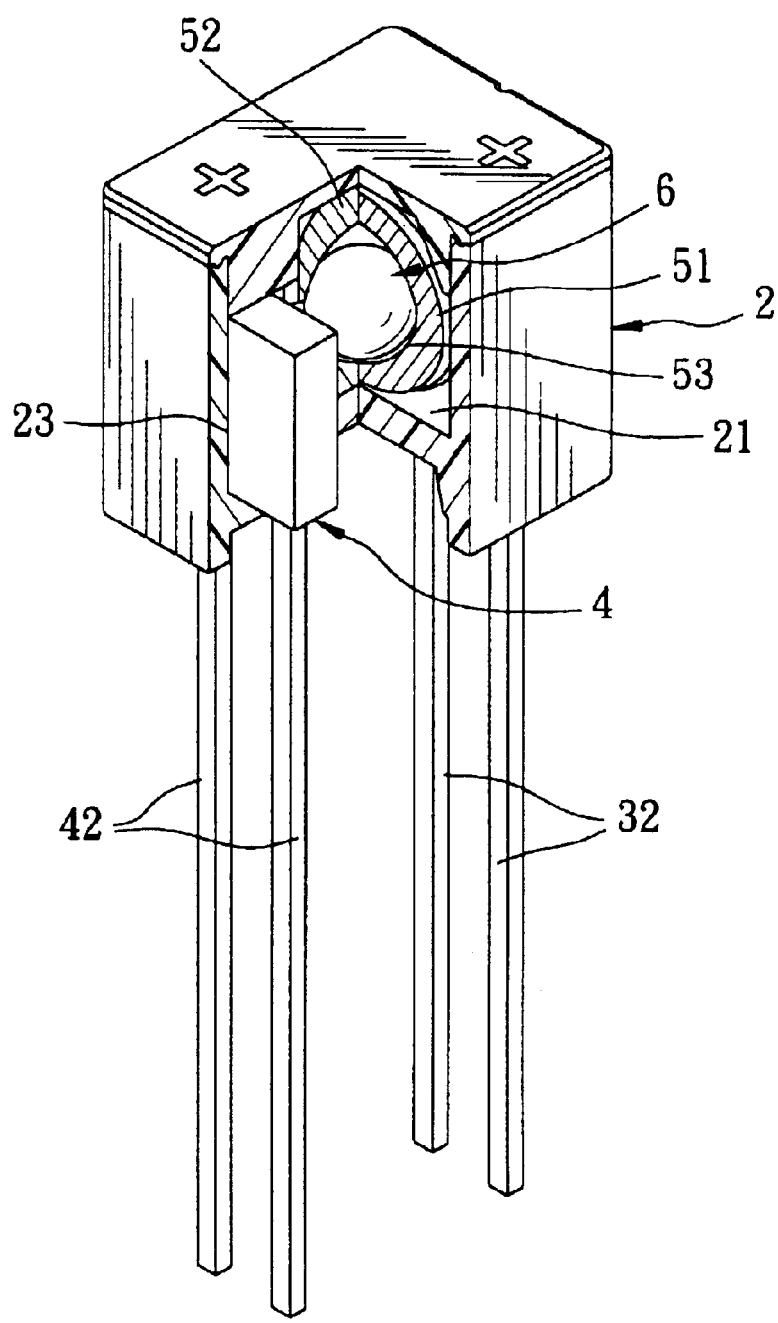
FIG. 3 is a fragmentary perspective view of the preferred embodiment.
Figure 4:
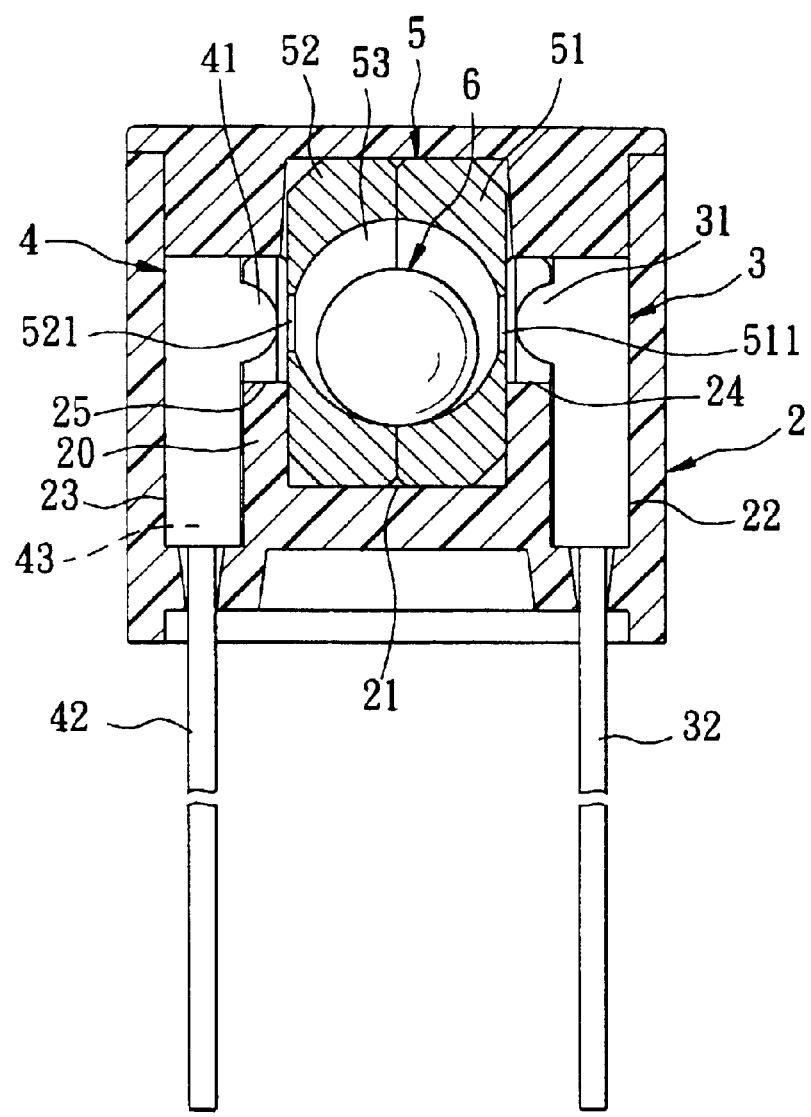
FIG. 4 is a sectional schematic view of the preferred embodiment.

Referring to FIGS. 2 to 4, the preferred embodiment of a vibration switch according to the present invention is adapted to be in electric contact with a support (not shown) for a theft-preventing device, and is shown to comprise an insulating housing 2, an optoelectronic sensor member, and a rollable member 6.

The housing 2 is adapted to be mounted on the support in an upright direction, and includes an inner wall 20 which confines two side concavities 22,23 that are disposed opposite to each other in a transverse direction relative to the upright direction, and a central concavity 21 between the side concavities 22,23. The inner wall 20 has emitting and receiving slits 24,25 which are spaced apart from each other, and which extend and which are aligned with each other along a line in the transverse direction so as to communicate the side concavities 22,23 with the central concavity 21. An opaque member 5 is received in the central concavity 21, and is made from metal, such as copper. The opaque member 5 includes two halves 51,52 which are fitted to each other and which have inner rolling surfaces that cooperatively confine an accommodation chamber 53 therein, and two openings 511,521 to communicate the accommodation chamber 53 with the emitting and receiving slits 24,25, respectively. The accommodation chamber 53 has a curved bottom area.

The optoelectronic sensor member includes light emitting and receiving units 3,4 which are retained in the side concavities 22,23, respectively. The light emitting and receiving units 3,4 respectively have light emitting and receiving points 31,41 which are respectively disposed in the emitting and receiving slits 24,25 and which face the accommodation chamber 53 go as to define light emitting and receiving paths, respectively. The light emitting and receiving paths cooperatively establish a light beam route which extends through the inner wall 20 and into the accommodation chamber 53 for passage of a light beam which is emitted from the light emitting unit 3, and Which is to be received by the receiving unit 4. The light emitting and receiving units 3,4 further have a pair of first electric contact terminals 32 and a pair of second electric contact terminals 42, respectively, which extend downwardly and outwardly of the housing 2 so as to be adapted to be connected electrically to the support. An actuator 43 is disposed to be electrically connected to the light receiving point 42 and the electric contact terminals 42.

The rollable member 6 is made from a light-transmission material, such as glass or plastic, and is a spheroid in this embodiment. The rollable member 6 is disposed to be rollable in the accommodation chamber 53.

As such, when the insulating housing 2 is in a stable position, i.e. when the insulating housing 2 stands in the upright direction, as shown in FIG. 4, the rollable member 6 is in a rest position, where the rollable member 6 rests on the bottom area of the accommodation chamber 53, and is disposed on the light beam route with a first orientation so as to interfere with the light beam such that the resultant light beam received by the receiving point 41 has a first light intensity. In this position, the electric contact terminals 42 are put in a switch-off state. Once a jerking force acts on the insulating housing 2, i.e. the insulating housing 2 is vibrated or tilted, the rollable member 6 will roll to a labile position, where the rollable member 6 is disposed on the light beam route with a second orientation so as to interfere with the light beam, e.g. by refraction, deflection or reflection, such that the resultant light beam received by the receiving point 41 has a second light intensity that differs from the first light intensity by a predetermined quantity. Upon detection of the predetermined quantity, the actuator 43 will be actuated to put the electric contact terminals 42 in a switch-on state. It is noted that the actuator 43 can be configured to be actuatable in response to different predetermined quantities so that the vibration switch of this invention can be adapted for use in a theft-preventing device disposed on an electronic device or an article of manufacture, such as a portable computer, an automobile, a suitcase, etc., to generate different operational modes.

Figure 5:
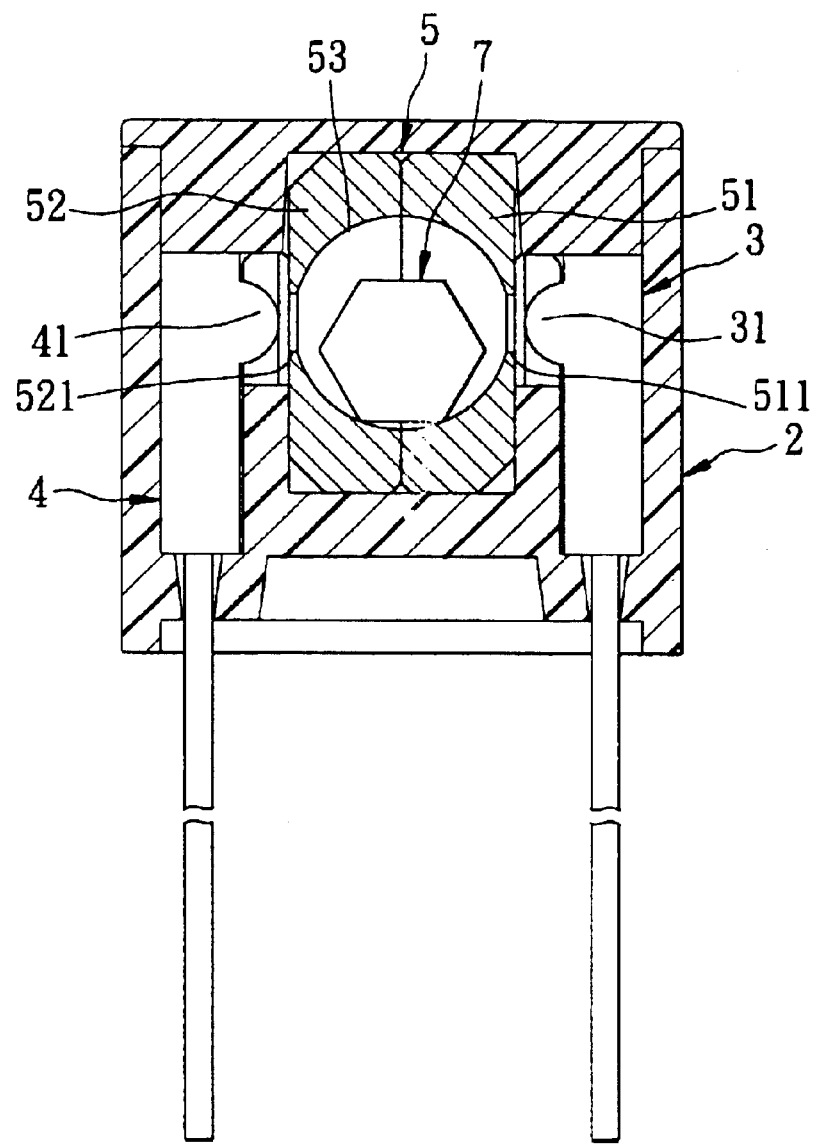
FIG. 5 is a sectional schematic view of another preferred embodiment of a vibration switch according to this invention.

Alternatively, the rollable member 7 maybe a polyhedron, such as a hexahedron as shown in FIG. 5.

As illustrated, since the rollable member 6,7 is made from a non-metal material, and since the optoelectronic sensor member is used, the electrical connection between the electric contact terminals 42 can be stable even when the vibration switch is used in a moist place.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

I claim:

1. A vibration switch adapted to be in electric contact with a support, said device comprising:

an insulating housing adapted to be mounted on the support in an upright direction, and including an inner wall which confines an accommodation chamber therein;

an optoelectronic sensor member secured to said housing, and including light emitting and receiving units which are disposed opposite to each other in a transverse direction relative to the upright direction, said light emitting and receiving units respectively defining a light emitting path and a light receiving path which extend through said inner wall and into said accommodation chamber to cooperatively establish a light beam route for passage of a light beam that is emitted from said light emitting unit and that is received by said receiving unit, said optoelectronic sensor member further including two electric contact terminals which extend downwardly and outwardly of said housing so as to be adapted to be connected electrically to the support; and a rollable member made from a light-transmission material, and disposed to be rollable in said accommodation chamber between a rest position, where said rollable member is disposed on said light beam route with a first orientation so as to interfere with said light beam, such that the resultant light beam received by said receiving unit has a first light intensity, and where said insulating housing is in a stable position, and a labile position, where, due to a jerking force acting on said insulating housing, said rollable member is disposed on said light beam route with a second orientation so as to interfere with said light beam, such that the resultant light beam received by said receiving unit has a second light intensity that differs from the first light intensity by a predetermined quantity, said optoelectronic sensor member further including an actuator which, in response to detection of the predetermined quantity, puts said electric contact terminals in one of switch-on and switch-off states.

2. The vibration switch of claim 1, wherein said insulating housing has two concavities disposed opposite to each other in the transverse direction and retaining said light emitting and receiving units therein, respectively, said inner wall having emitting and receiving slits which are spaced apart from each other, which extend and which are aligned with each other along a line in the transverse direction, and which are communicated with said concavities to define said light beam route.

3. The vibration switch of claim 2, wherein said inner wall has an opaque rolling surface confining said accommodation chamber.

4. The vibration switch of claim 3, wherein said rolling surface is made from a metal material.

5. The vibration switch of claim 3, wherein said rollable member is a spheroid.

6. The vibration switch of claim 3, wherein said rollable member is a polyhedron.

7. The vibration switch of claim 3, wherein said rolling surface has a bottom area to receive said rollable member in the rest position.

\* \* \* \* \*